US010901453B2

(12) United States Patent
Kamezawa et al.

(10) Patent No.: US 10,901,453 B2
(45) Date of Patent: *Jan. 26, 2021

(54) SEMICONDUCTOR INTEGRATED CIRCUIT, AND METHOD FOR SUPPLYING CLOCK SIGNALS IN SEMICONDUCTOR INTEGRATED CIRCUIT

(71) Applicant: RICOH COMPANY, LTD., Tokyo (JP)

(72) Inventors: Sho Kamezawa, Osaka (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/265,251

(22) Filed: Feb. 1, 2019

(65) Prior Publication Data

US 2019/0163231 A1     May 30, 2019

Related U.S. Application Data

(63) Continuation of application No. 15/441,617, filed on Feb. 24, 2017, now Pat. No. 10,234,891.

(30) Foreign Application Priority Data

Mar. 16, 2016 (JP) ................... 2016-052602
Dec. 13, 2016 (JP) ................... 2016-241633

(51) Int. Cl.
*G06F 1/10* (2006.01)
*H04N 5/378* (2011.01)
(Continued)

(52) U.S. Cl.
CPC ............ *G06F 1/10* (2013.01); *H03L 7/00* (2013.01); *H04N 5/378* (2013.01); *H04N 5/3765* (2013.01)

(58) Field of Classification Search
CPC ...... G06F 1/04; G06F 1/06; G06F 1/08; G06F 1/10; G06F 1/12; H03K 5/15;
(Continued)

(56) References Cited

U.S. PATENT DOCUMENTS 4,812,684 A    3/1989 Yamagiwa et al.
5,307,381 A *  4/1994 Ahuja ............... H03K 5/1508
                                                    327/156
(Continued)

FOREIGN PATENT DOCUMENTS

JP    H05-063083    3/1993
JP    5-159080      6/1993
(Continued)

OTHER PUBLICATIONS

Sep. 18, 2018 Japanese official action in connection with corresponding Japanese patent application No. 2016-241633.
(Continued)

*Primary Examiner* — Thomas J. Hiltunen
(74) *Attorney, Agent, or Firm* — Oblon, McClelland, Maier & Neustadt, L.L.P.

(57) ABSTRACT

A semiconductor integrated circuit on a rectangular semiconductor substrate includes timing generation circuits having the same functions of generating control clock signals to corresponding input buffer circuits based on a control reference clock signal, and a parallel processing circuit unit divided into circuit blocks having equal areas and corresponding to the timing generation circuits. Each circuit block includes clock distribution networks corresponding to the control clock signals. The parallel processing circuit unit carries out processes in parallel for each clock distribution network. Each clock distribution network includes the input buffer circuit; a clock buffer circuit connected to the input buffer circuit and placed approximately in a central position
(Continued)

of the corresponding circuit block relative to the semiconductor substrate longitudinal direction; and end devices. The clock buffer circuit outputs a control output clock signal to be distributed and supplied to the end devices.

19 Claims, 13 Drawing Sheets

(51) Int. Cl.
*H04N 5/376* (2011.01)
*H03L 7/00* (2006.01)

(58) Field of Classification Search
CPC .......... H03K 5/15013; H03K 5/15026; H03K 5/1504; H03K 5/1506; H03K 5/1508
See application file for complete search history.

(56) References Cited

U.S. PATENT DOCUMENTS

| | | | | |
|---|---|---|---|---|
| 5,396,129 A * | 3/1995 | Tabira | ............... | H03K 5/15066 326/101 |
| 5,430,397 A * | 7/1995 | Itoh | ............... | G06F 1/10 326/101 |
| 5,517,147 A * | 5/1996 | Burroughs | ............... | G06F 1/06 327/269 |
| 5,668,484 A | 9/1997 | Nomura | | |
| 5,886,917 A | 3/1999 | Yasukawa et al. | | |
| 5,911,063 A | 6/1999 | Allen et al. | | |
| 6,111,448 A * | 8/2000 | Shibayama | ............... | G06F 1/10 327/291 |
| 6,137,336 A | 10/2000 | Baba et al. | | |
| 6,204,713 B1 | 3/2001 | Adams et al. | | |
| 6,255,884 B1 * | 7/2001 | Lewyn | ............... | G06F 1/10 327/293 |
| 6,380,788 B1 | 4/2002 | Fan et al. | | |
| 6,429,714 B1 | 8/2002 | Schultz | | |
| 6,538,489 B2 * | 3/2003 | Nakano | ............... | H03K 5/15013 326/28 |
| 6,856,171 B1 * | 2/2005 | Zhang | ............... | H03K 5/135 326/46 |
| 7,005,907 B2 * | 2/2006 | Ibuka | ............... | G06F 1/10 327/156 |
| 7,071,754 B2 * | 7/2006 | Tahara | ............... | G06F 1/10 327/291 |
| 7,490,257 B2 * | 2/2009 | Endo | ............... | G06F 1/10 713/401 |
| 7,741,877 B2 * | 6/2010 | Roche | ............... | G06F 1/10 326/13 |
| 8,570,200 B2 * | 10/2013 | Ashburn, Jr. | ............... | H03M 3/344 341/143 |
| 8,887,114 B2 * | 11/2014 | Hill | ............... | G06F 30/392 716/113 |
| 9,030,253 B1 | 5/2015 | Ngai | | |
| 9,213,359 B2 * | 12/2015 | Prakash | ............... | G06F 1/10 |
| 10,234,891 B2 * | 3/2019 | Kamezawa | ............... | G06F 1/10 |
| 2002/0060594 A1 | 5/2002 | Stasiak et al. | | |
| 2005/0053180 A1 | 3/2005 | Nose et al. | | |
| 2006/0006917 A1 | 1/2006 | Kao | | |
| 2007/0216464 A1 * | 9/2007 | Roche | ............... | G06F 1/10 327/295 |
| 2007/0286323 A1 | 12/2007 | Shimobeppu | | |
| 2008/0252341 A1 * | 10/2008 | Kim | ............... | H03L 7/0812 327/157 |
| 2012/0105123 A1 | 5/2012 | Brown et al. | | |
| 2015/0296164 A1 | 10/2015 | Hirai | | |
| 2015/0323959 A1 * | 11/2015 | Arabi | ............... | H03L 7/0812 327/270 |
| 2017/0269630 A1 | 9/2017 | Kamezawa et al. | | |

FOREIGN PATENT DOCUMENTS

| | | |
|---|---|---|
| JP | H10-229164 | 8/1998 |
| JP | 2004-159239 A | 6/2004 |
| JP | 2009-200546 | 9/2009 |
| JP | 2013-219442 | 10/2013 |
| JP | 2015-204471 | 11/2015 |

OTHER PUBLICATIONS

Office Action dated Jan. 29, 2019 in Japanese Patent Application No. 2016-241633.

* cited by examiner

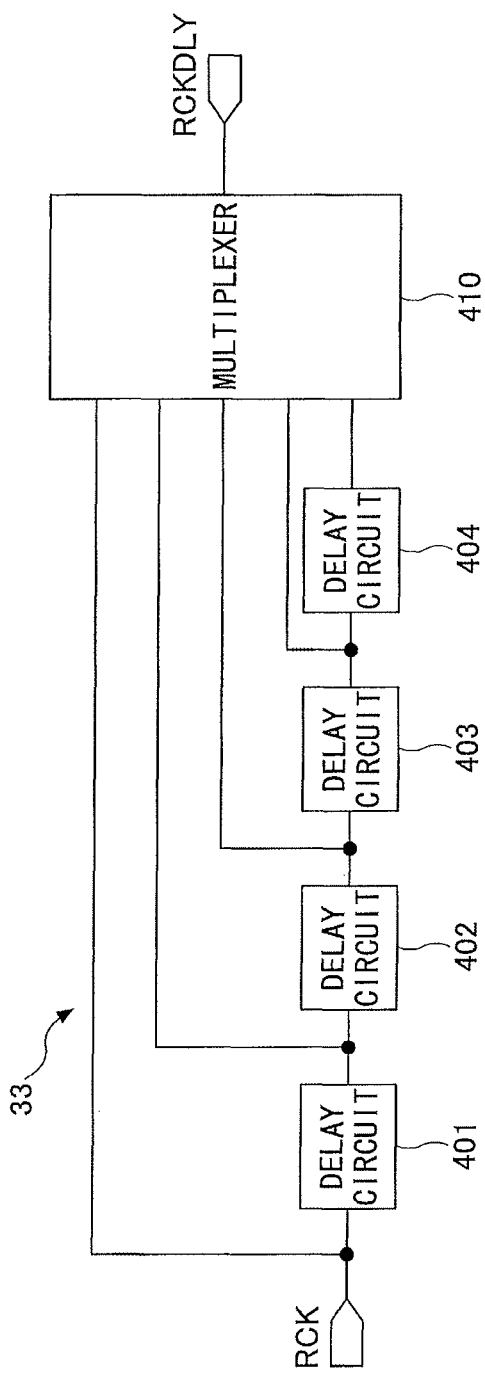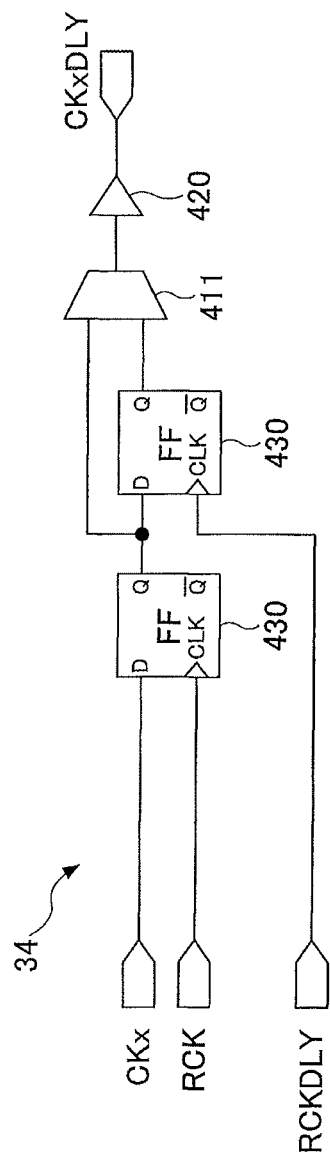
FIG.7A
FIG.7B

SEMICONDUCTOR INTEGRATED CIRCUIT, AND METHOD FOR SUPPLYING CLOCK SIGNALS IN SEMICONDUCTOR INTEGRATED CIRCUIT

CROSS-REFERENCE TO APPLICATIONS

The present application claims is a Rule 1.53(b) Continuation of U.S. application Ser. No. 15/441,617, filed Feb. 24, 2017, claiming priority under 35 U.S.C. § 119 to Japanese Patent Application No. 2016-052602, filed Mar. 16, 2016, and Japanese Patent Application No. 2016-241633, filed Dec. 13, 2016. The contents of Japanese Patent Application No. 2016-052602 and Japanese Patent Application No. 2016-241633 are incorporated herein by reference in their entirety.

BACKGROUND

1. Technical Field

The present invention relates to a semiconductor integrated circuit, and a method for supplying clock signals in a semiconductor integrated circuit.

2. Description of the Related Art

Recently, along with a miniaturization and an increase in integration of semiconductor integrated circuits, the widths and the intervals of clock signal supply interconnections have been reduced. As a result, due to an increase in the wiring resistance and the wiring capacitance of the clock signal supply interconnections, differences in clock signal arrival timings (clock skew), clock signal voltage attenuation, and deterioration in sharpness of signal rise and fall characteristics may occur.

Generally speaking, internal operations of a semiconductor integrated circuit are synchronized with a clock signal. Therefore, if the above-mentioned phenomena occur in such a level as to exceed a threshold, the circuit may malfunction such as to take in inappropriate signals, generate whisker-pulse noises, or the like.

SUMMARY

According to one aspect, a semiconductor integrated circuit formed on a rectangular semiconductor substrate includes a plurality of timing generation circuits that have the same functions configured to generate a plurality of control clock signals to be supplied to corresponding input buffer circuits based on a control reference clock signal; and a parallel processing circuit unit divided into a plurality of circuit blocks that have equal areas, a number of the circuit blocks being equal to a number of the timing generation circuits. Each of the circuit blocks includes a plurality of clock distribution networks, the clock distribution networks corresponding to the control clock signals, respectively, and a number of the clock distribution networks being equal to a number of the control clock signals. The parallel processing circuit unit is configured to carry out processes in parallel for each of the clock distribution networks. Each of the clock distribution networks includes the corresponding input buffer circuit; a clock buffer circuit connected to the input buffer circuit in series and placed approximately in a central position of the corresponding circuit block relative to the semiconductor substrate longitudinal direction; and a plurality of end devices connected to the clock buffer circuit through clock signal connection wires that branch off from the clock buffer circuit. The clock buffer circuit is configured to output a control output clock signal to be distributed and supplied to the end devices.

Other objects, features, and advantages will become more apparent from the following detailed description when read in conjunction with the accompanying drawings.

BRIEF DESCRIPTION OF THE DRAWINGS

FIG. 7A illustrates an example of the phase adjustment circuit inserted in the input stage of the timing generation circuit of FIG. 6;

FIG. 7B illustrates an example of the phase adjustment circuit inserted in the output stage of the timing generation circuit of FIG. 6;

DETAILED DESCRIPTION OF EMBODIMENTS

In one method to eliminate clock skew, a clock signal distribution system is designed in such a manner that a plurality of buffer circuits are inserted in clock signal supply connections from an input terminal through destination devices, and clock signal supply connections are made to have a tree configuration, or the like. In more detail, a clock signal supply connection is branched gradually into two branches, four branches, eight branches, and so forth, where the load capacitances of the buffer circuits at the respective stages are made equal. However, in the method to distribute a clock signal using tree-configuration clock signal supply connections, a design is made in such a manner to make interconnections between respective nodes have equal lengths and equal capacitances. As a result, the circuit configuration may become complicated, and a design may become difficult. In particular, in a solid-state image sensing device (i.e., a linear sensor), as a semiconductor chip having an aspect ratio generally on the order of several multiple of ten, it may be difficult to include many stages of buffer circuits, due to area constraint. Also, it may be difficult to make a wiring design where wiring lengths and load capacitances are equal. Therefore, it may be difficult to sufficiently control clock signal wiring delay and waveform distortion. Thus, it may be difficult to increase the operation speed.

According to a patent reference No. 1 (Japanese Laid-Open Patent Application No. 2009-200546), a first column AD circuit and a second column AD circuit have signal phases opposite to one another where horizontal transfer bus lines cross, for reducing noise generation, in a horizontally long solid-state image sensing device. The first column AD circuits and the second column AD circuits are placed alternately for each certain number of circuits.

Figure 10A:
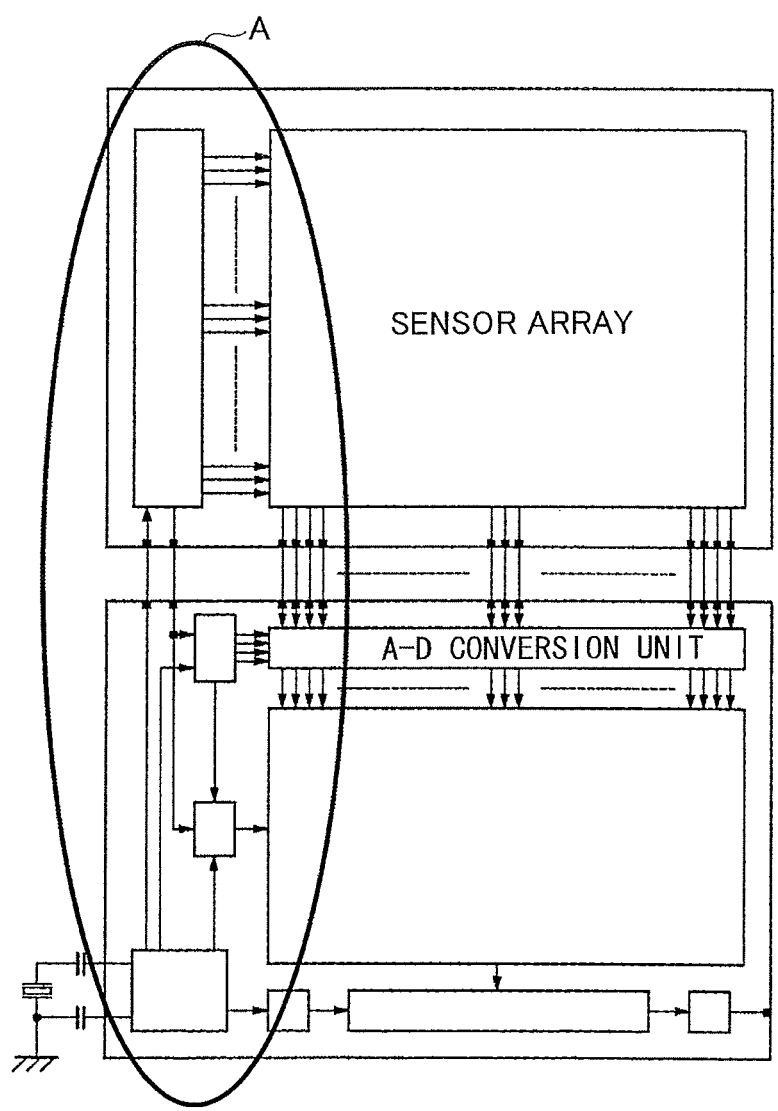
FIG. 10A illustrates a semiconductor integrated circuit in the related art.
Figure 10B:
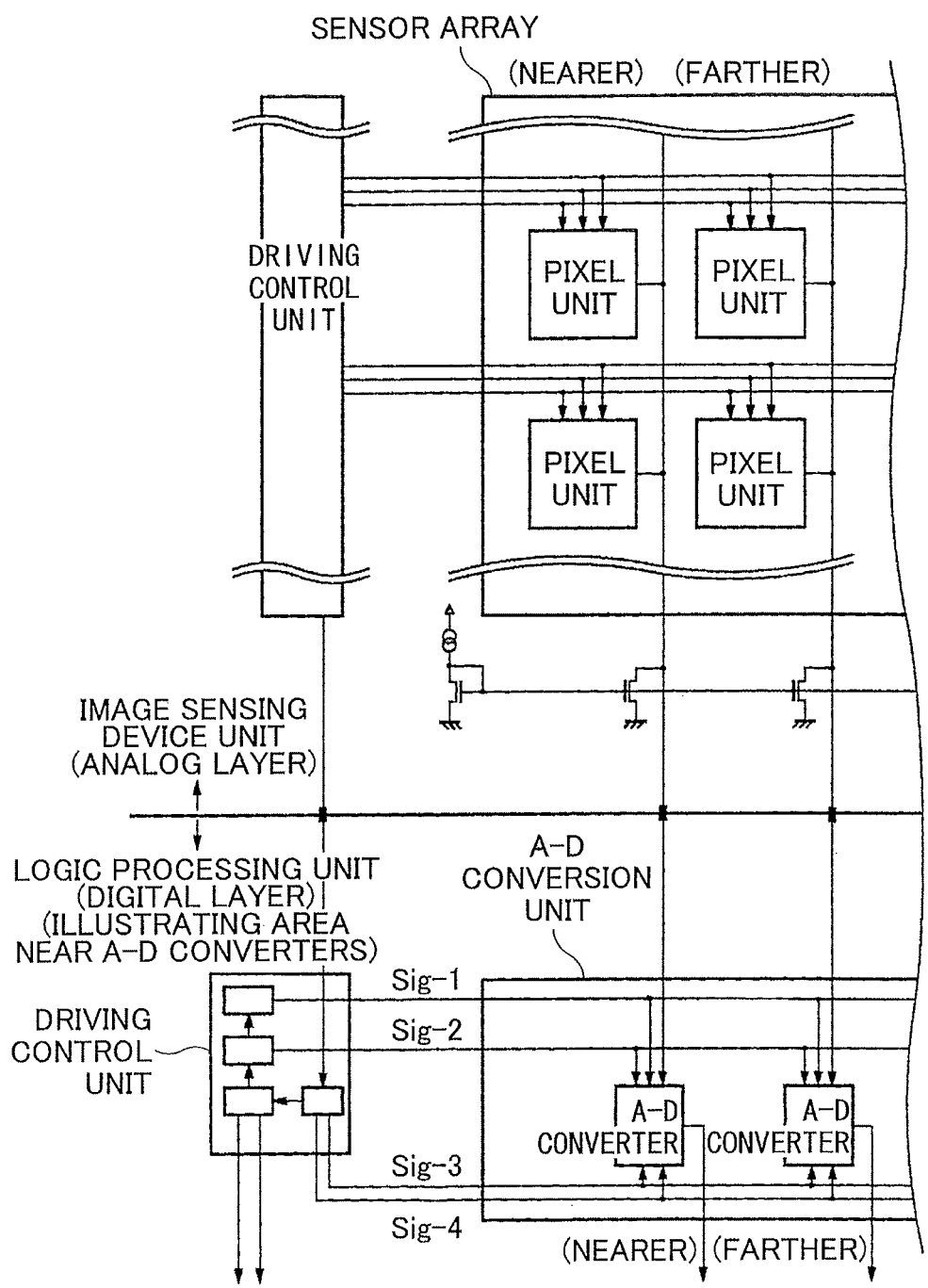
FIG. 10B is a magnified view of the semiconductor integrated circuit illustrated in FIG. 10A.

According to a patent reference No. 2 (Japanese Laid-Open Patent Application No. 2015-204471), as illustrated in FIG. 10A illustrating a block diagram of an image sensing device and in FIG. 10B illustrating a relationship between an imaging unit and an A-D conversion unit, independent driving signals (Sig-1 and Sig-2; and Sig-3 and Sig-4) are generated by a driving control unit at a left-center area, and are supplied to pixel units and A-D converters. As illustrated in FIG. 10B, the signal connection lines from the driving control unit extend straightly in a lateral direction to the pixel units and the A-D converters, sequentially.

In the configuration of the patent reference No. 1, it may be possible to reduce cross talk between the crossing signal supply connection wires. However, the signal supply connection wiring resistance and capacitance are not reduced, and the wiring delay and the waveform distortion are not reduced.

In the configuration of the patent reference No. 2, differences may occur in the arriving timings of the control signals supplied from the driving control unit to the nearer pixels units and A-D converters versus the farther pixels units and A-D converters, or the signal voltage attenuation may occur in the signal supply connection wires. If differences occur in the arriving timings or the signal voltage attenuation occurs, malfunctions may occur in subsequent digital processing units due to mismatching in the processing timings.

The embodiments have been devised to provide semiconductor integrated circuits with which it is possible to reduce clock signal wiring delay and waveform distortion, to enable high-speed operation.

Below, the embodiments will be described with reference to the accompanying drawings. Note that, in the specification and drawings, the same reference numerals are given to elements having substantially the same functions, and duplicated description will be omitted.

<Example of Semiconductor Integrated Circuit>

Figure 1:
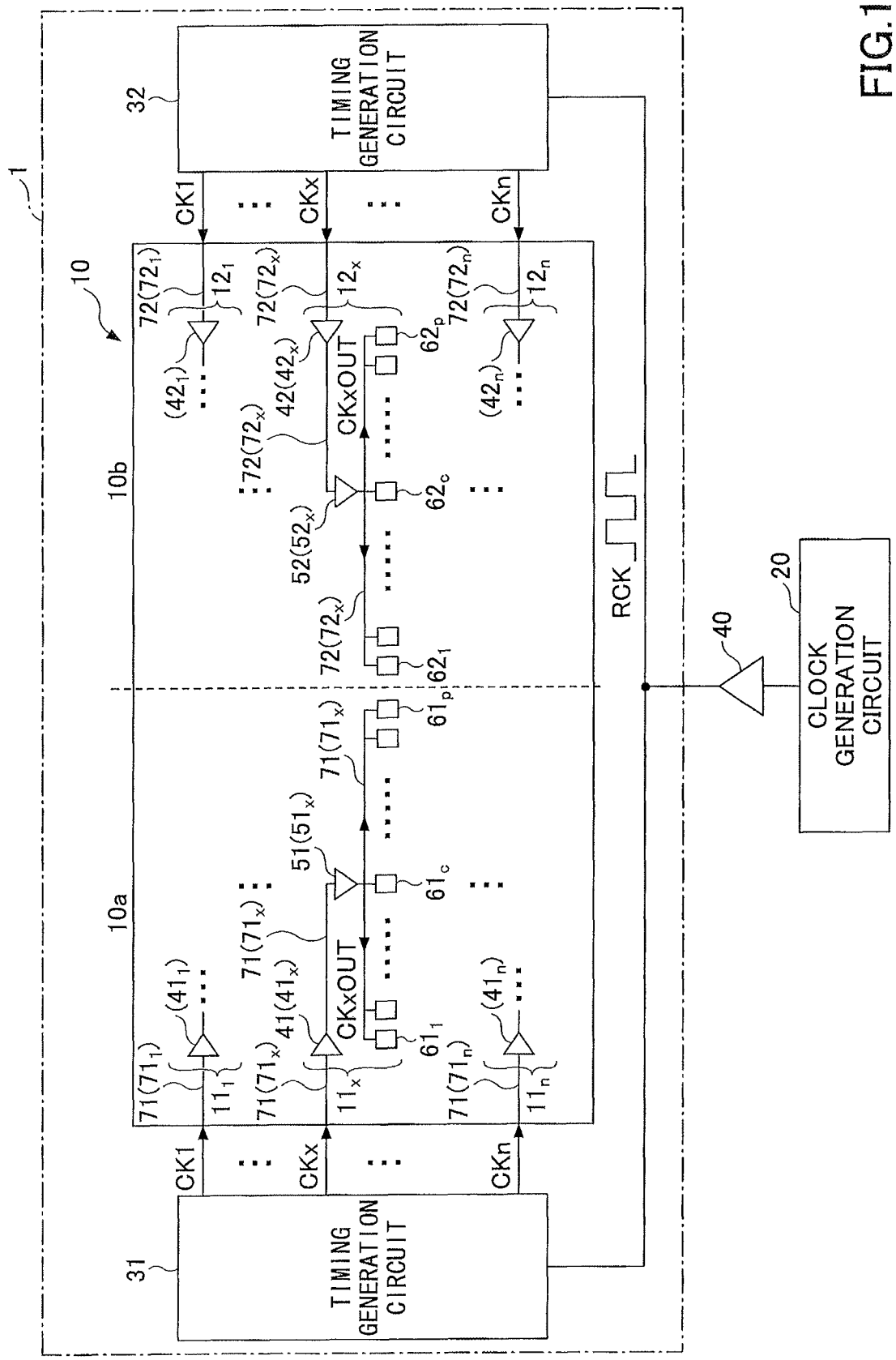
FIG. 1 illustrates a configuration example of a semiconductor integrated circuit according to an embodiment where two timing generation circuits are arranged laterally.

FIG. 1 illustrates an example of a semiconductor integrated circuit according to an embodiment where two timing generation circuits are arranged laterally. The semiconductor integrated circuit 1 is formed on a rectangular semiconductor substrate that has a pair of long sides and a pair of short sides. The semiconductor substrates on which the semiconductor integrated circuits 1 are formed may be applied to, for example, solid-state image sensing devices such as linear sensors that are one-dimensional image sensors (i.e., linear image sensors or line image sensors).

The semiconductor integrated circuit 1 includes a parallel processing circuit unit 10 and timing generation circuits 31 and 32. To the semiconductor integrated circuit 1, a clock generation circuit 20 is connected through a buffer 40. In the example of FIG. 1, the single buffer 40 is used. However, a plurality of the buffers 40 may be used in series instead.

The clock generation circuit 20 generates a control reference clock signal RCK having a predetermined frequency using an externally input clock signal, i.e., for example, a clock signal generated by a crystal oscillation circuit using a crystal oscillator as a reference signal. The clock generation circuit 20 acquires the control reference clock signal RCK and adjusts the frequency of the control reference clock signal RCK to be supplied to the timing generation circuits 31 and 32 of the semiconductor integrated circuit 1. Thus, the clock generation circuit 20 outputs the generated control reference clock signal RCK having the predetermined frequency to the timing generation circuits 31 and 32 through the buffer 40.

The clock generation circuit 20 can supply the control reference clock signals RCK having the adjustable frequency to the plurality of timing generation circuits 31 and 32, respectively. The clock generation circuit 20 can supply the control reference clock signal with reduced frequency if high-speed operation is not carried out. Thus, it is possible to reduce the power consumption.

The clock generation circuit 20 and the buffer 40 may be included in the semiconductor integrated circuit 1 instead of being connected outside the semiconductor integrated circuit 1 as illustrated in FIG. 1.

In the semiconductor integrated circuit 1, each of the timing generation circuits (timing generators) 31 and 32 has the same functions, and generates a plurality of control clock signals CK1 through CKn based on the control reference clock signal RCK supplied by the clock generation circuit 20. In more detail, each of the two timing generation circuits 31 and 32 generates the control clock signals CK1 through CKn in synchronization with the control reference clock signal RCK having the adjustable frequency supplied by the clock generation circuit 20.

In the parallel processing circuit unit 10, a plurality of circuit blocks 10a and 10b having the same functions are placed in parallel. Each of the circuit blocks 10a and 10b carries out processes in parallel based on the control clock signals CK1 through CKn that are examples of a plurality of input signals. The respective circuit blocks 10a and 10b have approximately equal areas acquired from equally dividing the parallel processing circuit unit 10.

In each of the circuit blocks 10a and 10b, n clock distribution networks $11_1$ through $11_n$ or $12_1$ through $12_n$ are formed to receive the corresponding n control clock signal CK1 through CKn.

The circuit block 10a includes n input buffer circuits 41 (i.e., $41_1$ through $41_n$), n clock buffer circuits 51 (i.e., $51_1$ through $51_n$), and p end devices 61 (i.e., $61_1$ through $61_p$) for each of the clock buffer circuits 51. The input buffer circuits 41, the clock buffer circuits 51, and the end devices 61 are connected through clock signal connection wires 71 (i.e., $71_1$ through $71_n$), respectively.

In the same way, the circuit block 10b includes n input buffer circuits 42 (i.e., $42_1$ through $42_n$), n clock buffer circuits 52 (i.e., $52_1$ through $52_n$), and p end devices 62 (i.e., $62_1$ through $62_p$) for each of the clock buffer circuits 52. The input buffer circuits 42, the clock buffer circuits 52, and the end devices 62 are connected through clock signal connection wires 72 (i.e., $72_1$ through $72_n$), respectively.

In the circuit blocks 10a and 10b having the same functions, the 2n clock distribution networks $11_1$ through $11_n$ and $12_1$ through $12n$ are repetitious units in each of which the same number of the same elements are arranged in the same way.

The circuits (i.e., the circuit block 10a and 10b including the clock distribution networks $11_1$ through $11_n$ and $12_1$ through 12n) having the same functions included in the parallel processing circuit unit 10 carry out at least one of analog signal processing, analog-to-digital (i.e., A-D) conversion, and digital signal processing.

To each of the clock distribution networks 11 and 12 of the circuit blocks 10a and 10b, the corresponding one of the control clock signals CK1 through CKn supplied by the timing generation circuits 31 and 32 is supplied separately. Note that, to corresponding pair 11x and 12x, for example, of the clock distribution networks 11 and 12 of the circuit blocks 10a and 10b, the same control clock signals CKx, in this example, are supplied in the same timing from the timing generation circuits 31 and 32, respectively.

In each of the clock distribution networks 11 and 12, the corresponding input buffer circuit 41 or 42 is connected at an end position of the corresponding circuit block 10a or 10b, and the corresponding one of the control clock signals CK1 through CKn is supplied directly to the input buffer circuit 41 or 42.

In more detail, the input buffer circuits 41 and 42 amplify and shape the waveforms of the control clock signals CK1 through CKn that have been input, as appropriate, in such a manner that the control clock signals will have such appropriate signal levels with respect to the thresholds of the end devices 61 and 62 that the devices will output expected logical values, respectively, in consideration of signal attenuation occurring in the clock signal connection wires 71 and 72.

The end devices 61 and 62 include, for example, switches, or logic circuits such as FF (flip-flop) circuits, inverter circuits, NAND circuits, NOR circuits, or the like.

The clock buffer circuits 51 and 52 are connected with the input buffer circuits 41 and 42, in series, respectively. Each of the clock buffer circuits 51 and 52 is placed approximately in a central position of the corresponding one of the circuit blocks 10a and 10b relative to the longitudinal direction of the semiconductor substrate.

The clock buffer circuits 51 and 52 are inserted in order to avoid signal level attenuation. In more detail, the clock buffer circuits 51 and 52 adjust the signals shaped by the input buffer circuits 41 and 42, for avoiding delay of the signals otherwise occurring at the end devices $61_1$, $61_p$, $62_1$, and $62_p$ for which the clock signal connection wires 71 and 72 are longest, for example, at the ends in FIG. 1, in comparison to the end devices 61c and 62c for which the clock signal connection wires 71 and 72 are shortest, i.e., placed approximately in a central position. That is, the clock buffer circuits 51 and 52 avoid timing errors such as deterioration in the sharpness in the rising edges and the falling edges of the signals, otherwise occurring due to signal transmission of control output clock signal (CKxOUT, for example) among the laterally arranged end devices $61_1$ through $61_p$ and $62_1$ through $62_p$.

To the end devices $61_1$ through $61_p$ (in total having p outputs) and the end devices $62_1$ through $62_p$ (in total having p outputs), the control output clock signals (for example, CKxOUT) supplied by the clock buffer circuits 51 and 52 are supplied, and thus, are output to the output destinations.

In each of the clock distribution networks 11 and 12, the clock signal connection wire 71 or 72 supplies the output signal from the timing generation circuit 31 or 32 to the corresponding end devices $61_1$ through $61_p$ or $62_1$ through $62_p$, in a branching manner, through the clock buffer circuit 51 or 52 and the input buffer circuit 41 or 42.

In more detail, each of the clock signal connection wires 71 and 72, transmitting the corresponding one of the control clock signals CK1 through CKn, connects the output terminal of the timing generation circuit 31 or 32 to the input terminal of the corresponding input buffer circuit 41 or 42 placed at the end position of the circuit block 10a or 10b. Then, each of the clock signal connection wires 71 and 72 connects the output terminal of the corresponding input buffer circuit 41 or 42 to the input terminal of the corresponding clock buffer circuit 51 or 52 placed approximately in a central position of the corresponding circuit block 10a or 10b relative to the longitudinal direction of the semiconductor substrate. Then, each of the clock signal connection wires 71 and 72 connects the output terminal of the corresponding clock buffer circuit 51 or 52 to the corresponding end devices $61_1$ through $61_p$ or $62_1$ through $62_p$, to distribute the corresponding control output clock signal (for example, CKxOUT).

Each of the clock signal connection wires 71 and 72 connected with the output terminal of the corresponding clock buffer circuit 51 or 52 and distributing the corresponding control output clock signal (for example, CKxOUT), branches off in p branches for the corresponding p end devices $61_1$ through $61_p$ or $62_1$ through $62_p$, and is connected to the corresponding end devices $61_1$ through $61_p$ or $62_1$ through $62_p$. The end devices $61_1$ through $61_p$ or $62_1$ through $62_p$ are included in each of circuit blocks 10a and 10b that are included in the parallel processing circuit unit 10 and have the same functions.

In a case where the end devices $61_1$ through $61_p$ and $62_1$ through $62_p$ are switches (loads), for example, each of the switches can include a gate of a transistor (i.e., a capacitance load). In this case, as a result of, as described above, each of the clock signal connection wires 71 and 72 connecting the corresponding devices 31, 32, 41, 42, 51, 52, 61, and 62, in the corresponding clock distribution network 11x or 12x, for example, the corresponding p end devices (switches) $61_1$ through $61_p$ or $62_1$ through $62_p$ are turned on simultaneously, based on the corresponding control output clock signal (in this example, CKxOUT) acquired as a result of the corresponding control clock signal (for example, CKx) generated by the corresponding timing generation circuit 31 or 32 being adjusted by the corresponding buffers 41x or 42x and 51x or 52x, in this example.

In this configuration, in the semiconductor integrated circuit 1 formed on the rectangular semiconductor substrate, the plurality of timing generation circuits 31 and 32 that generate the plurality of control clock signals CK1 through CKn to determine the driving timings in synchronization with the control reference clock signal RCK are formed on the semiconductor chip. In the example of FIG. 1, the timing generation circuits 31 and 32 are placed at end positions laterally in the longitudinal direction of the semiconductor substrate. As a result, the control clock signals CK1 through CKn are supplied from the two timing generation circuits 31 and 32 toward the center of the substrate.

Thus, in comparison to the case where, as illustrated in FIGS. 10A and 10B, the single timing generation circuit is placed at an end, it is possible to shorten the signal connection wires. Thus, it is possible to also reduce the wiring resistance and wiring capacitance. Also, it is possible to reduce the number of end devices connected from each timing generation circuit in a case where the same number of end devices are connected in total. Therefore, it is possible share the gate capacitance to be driven between the respective timing generation circuits, and it is possible to reduce the load for each timing generation circuit.

Thus, as a result of using the plurality of timing generation circuits, it is possible to shorten the connection wires for each timing generation circuit. Therefore, it is possible to reduce the wiring resistance, the wiring capacitance, and so forth that cause wiring delay, signal voltage attenuation, and degradation in sharpness of signal rise and fall characteristics. Thus, consequently, it is possible to reduce differences in clock signal arrival timings (clock skew) caused by waveform distortion or clock signal wiring delay. Thus, it is possible to increase the clock signal frequency and achieve stable high-speed operation.

<Other Example of Semiconductor Integrated Circuit>

Figure 2:
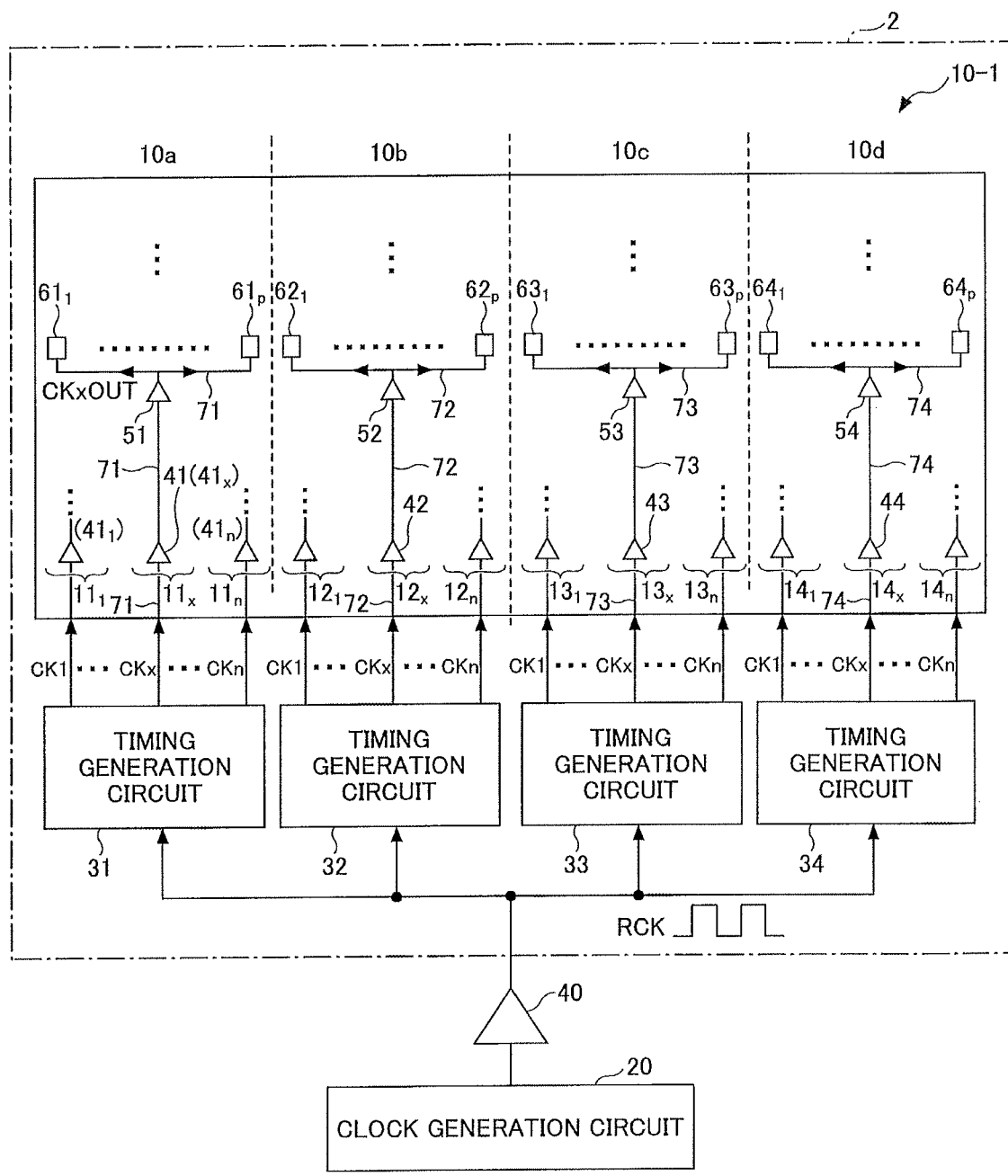
FIG. 2 illustrates one example of a configuration in a case where, according to a semiconductor integrated circuit of another embodiment, four timing generation circuits are provided at a lower section.

FIG. 2 illustrates one example of a configuration in a case where, according to a semiconductor integrated circuit of another embodiment, four timing generation circuits are placed at a lower section in FIG. 2. The example of FIG. 2 is different from the configuration of FIG. 1 in that a semiconductor integrated circuit 2 includes four timing generation circuits 31-34, and, in a parallel processing circuit unit 10-1, four circuit blocks 10a-10d are included to correspond to the timing generation circuits 31-34.

The respective circuit blocks 10a-10d are acquired from dividing the parallel processing circuit unit 10-1 in such a manner that the circuit blocks 10a-10d have approximately equal areas.

To clock distribution networks 11 (i.e., $11_1$ through $11n$); clock distribution networks 12 (i.e., $12_1$ through $12n$); clock distribution networks 13 (i.e., $13_1$ through $13n$); or clock distribution networks 14 (i.e., $14_1$ through $14_n$) of each of the respective circuit blocks 10a, 10b, 10c, and 10d, control clock signals CK1 through CKn generated by the corresponding one of the timing generation circuits 31, 32, 33, and 34 are separately supplied.

The configuration of each of the clock distribution networks 11 and 12 is the same as the configuration of each of the clock distribution networks 11 and 12 of FIG. 1. Each of the clock distribution networks 13 includes an input buffer circuit 43, a clock buffer circuit 53, and a plurality of end devices $63_1$ through $63_p$, and these devices are connected through clock signal connection wires 73. Each of the clock distribution networks 14 includes an input buffer circuit 44, a clock buffer circuit 54, and a plurality of end devices $64_1$ through $64_p$, and these devices are connected through clock signal connection wires 74.

In this configuration, because the four timing generation circuits 31-34 are used, it is possible to shorten the signal connection wires in comparison to a case where a single timing generation circuit is placed at one end. Thus, it is possible to reduce also the wiring resistance and the wiring capacitance. Further, because it is possible to reduce the number of devices connected to the clock signal connection wires for each timing generation circuit, it is possible to share the gate capacitance to be driven among the respective timing generation circuits. Thus, it is possible to reduce the load for each timing generation circuit.

Also in this configuration, it is possible to reduce the wiring resistance, the wiring capacitance, and so forth, which cause wiring delay, signal voltage attenuation, and degradation in sharpness of signal rise and fall characteristics.

Note that, in the example of FIG. 2, all of the timing generation circuits 31-34 are placed at a lower position of the parallel processing circuit unit 10-1 of FIG. 2. However, it is also possible that, in the semiconductor integrated circuit 2, the timing generation circuits 31-34 are placed at any of an upper position, a lower position, a left position, and a right position.

Example No. 1 of Clock Buffer Circuits in Parallel Processing Circuit Units

Figure 3A:
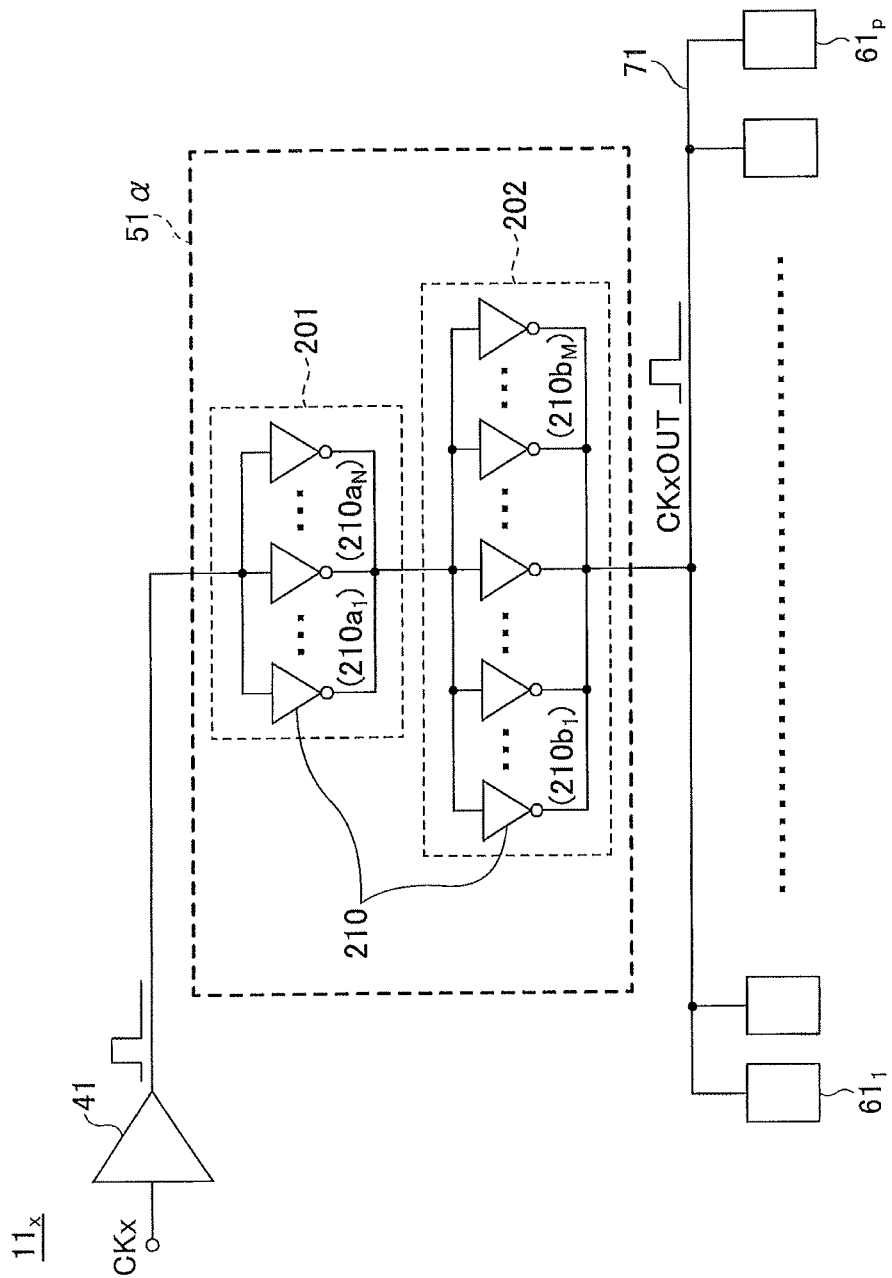
FIG. 3A illustrates an example where a clock buffer circuit included in a parallel processing circuit unit according to each embodiment has two stages of inverters.

FIG. 3A illustrates an example where each of the clock buffer circuits included in the parallel processing circuit unit according to each of the above-mentioned embodiments of FIGS. 1 and 2 has two stages of inverters. Note that, below, for the sake of simplification of description, in FIGS. 3A-5B, one clock distribution network $11x$ from among the clock distribution networks 11 included in the circuit block 10a will be described as an example. However, also each of the others of the clock distribution networks $11_1$ through $11_n$ included in the circuit block 10a has the same configuration. Also, the respective clock distribution networks 12, 13 and 14 included in the other circuit blocks 10b-10d have the same configurations.

In the example illustrated in FIG. 3A, a clock buffer circuit 51a includes a first-stage inverter circuit 201 and a second-stage inverter circuit 202. Each of the inverter circuits 201 and 202 includes a plurality of inverters 210.

In the first-stage inverter circuit 201, clock signal connection wires connect, in parallel, N inverters $210a_1$ through $210a_N$ connected to the output terminal of the input buffer circuit 41.

In the second-stage inverter circuit 202, M inverters $210b_1$ through $210b_M$ are connected, in parallel, to the output terminal of the first-stage inverter circuit 201.

The clock buffer circuit 51a supplies the clock signal to a plurality of end devices $61_1$ through $61_p$, through the clock signal connection wire 71. That is, the second-stage inverter circuit 202 supplies the clock signal to the end devices $61_1$ through $61_p$.

The numbers N and M of the inverters 210 are determined separately from the number n of the control clock signals CK1 through CKn. Concerning the number of the inverters 210 connected in parallel, a relationship that "the number N of the inverters included in the first-stage inverter circuit 201 is smaller than the number M of the inverters included in the second-stage inverter circuit 202" (i.e., N<M) holds. That is, such a design is made that the driving capability of the second-stage inverter circuit 202 including the inverters 210 in the second stage will be greater than the driving capability of the first-stage inverter circuit 202 including the inverters 210 in the first stage.

The numbers N and M are determined using the frequency of the control clock signals CK1 through CKn, and the loads of the end devices $61_1$ through $61_p$ (i.e., the thresholds or the gate capacitances). The greater the frequency and the loads are, the greater the numbers N and M are determined accordingly.

Example No. 2 of Clock Buffer Circuits in Parallel Processing Circuit Units

Figure 3B:
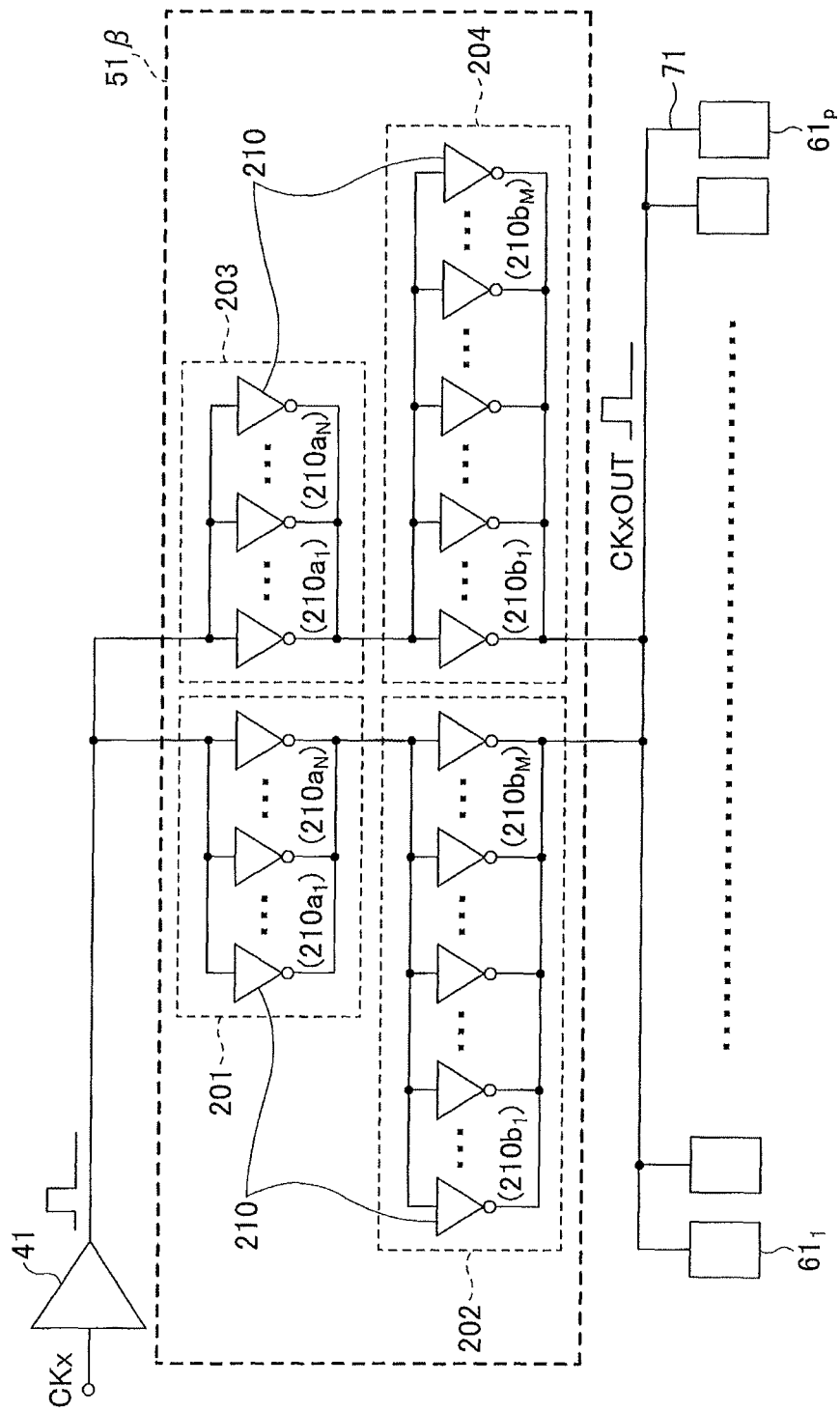
FIG. 3B illustrates one example where a clock buffer circuit included in a parallel processing circuit unit according to each embodiment has two outputs.

FIG. 3B illustrates one example where each of the clock buffer circuits included in the parallel processing circuit unit according to each of the above-mentioned embodiments of FIGS. 1 and 2 has two outputs.

In this example, as illustrated in FIG. 3B, a clock buffer circuit 5113 has a dual-output configuration having two outputs. In this configuration, a first-stage inverter circuit 203 including N inverters $210a_1$ through $210a_N$ has the same configuration as the above-mentioned the first-stage inverter circuit 201. Also, a second-stage inverter circuit 204 including M inverters $210b_1$ through $210b_M$ has the same configuration as the above-mentioned the second-stage inverter circuit 202.

As a result of the clock buffer circuit 5113 thus having the plurality of outputs, it is possible to increase the load driving power, and arrange the inverters 210 as the elements in a distributing manner. Note that, although the configuration having the two outputs has been described, it is also possible to use the configuration having three or more outputs instead.

Example No. 3 of Clock Buffer Circuits in Parallel Processing Circuit Units

Figure 4:
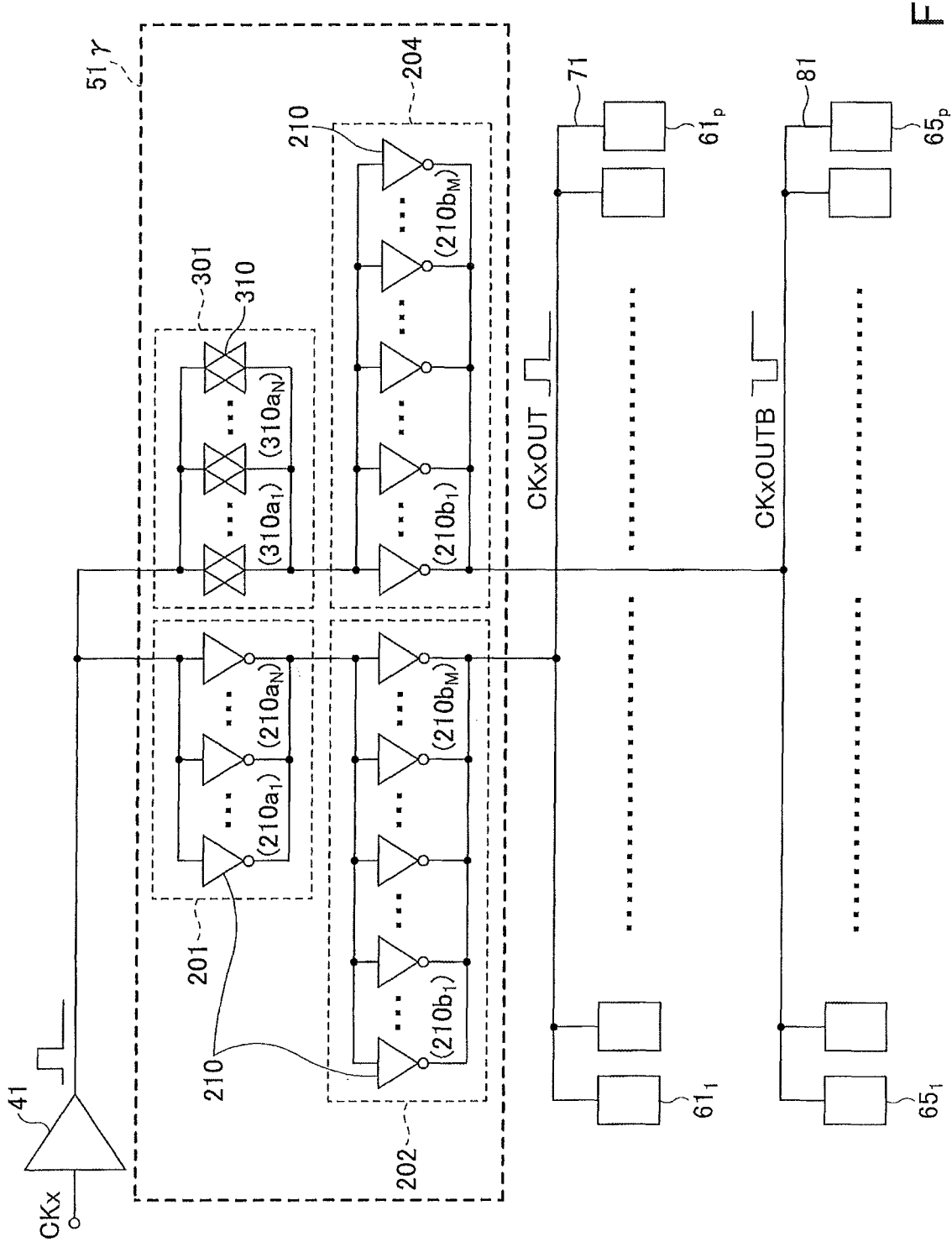
FIG. 4 illustrates an example where a clock buffer circuit included in a parallel processing circuit unit according to each embodiment transmits a non-inverted signal and an inverted signal.

FIG. 4 illustrates an example where each of the clock buffer circuits included in the parallel processing circuits unit according to each of the above-mentioned embodiments of FIGS. 1 and 2 transmits non-inverted signals and inverted signals.

If a clock signal is inverted, for example, as illustrated in FIG. 4 (i.e., CKxOUTB), in a clock buffer circuit 51y, a first-stage inverter circuit 203 is replaced with a transfer gate circuit 301. Also in this case, in the transfer gate circuit 301 in the first-stage, N transfer gates $310a_1$ through $310a_N$ are connected in parallel to the output terminal of the input buffer circuit 41.

By thus using the transfer gates 310, it is possible to make the delays equal occurring in the signals that are generated in the transfer gate circuit 301 in the first stage and flow through the clock signal connection wires connected to the end devices $65_1$ through $65_p$, without inverting the signals.

In a second-stage inverter circuit 204, in the same way as FIG. 3B, M inverters $210b_1$ through $210b_M$ are connected in parallel, subsequent to the transfer gate circuit 301 of the first stage. Thus, the relationship of N<M holds also in this case.

The signal from the clock buffer circuit 51γ is supplied to end devices $61_1$ through $61_p$ and $65_1$ through $65_p$ through clock signal connection wires 71 and 81. The end devices $61_1$ through 61p include, for example, the gates of p-channel transistors of CMOS switches, and the end devices $65_1$ through $65_p$ include, for example, the gates of n-channel transistors of the CMOS switches.

It is also possible for a circuit structure to use the inverted control output clock signals CKxOUTB that are the inverted signal with respect to the control output clock signal CKxOUT, without using the non-inverted signal CKxOUT. Additionally, it is also possible that each clock buffer circuit has three or more stages instead of the two stages as illustrated in FIG. 4.

In case of thus increasing the number of stages, it is possible to increase the driving capability by increasing the number of the inverters or the transfer gates included in the last stage. By thus connecting the plurality of inverters 210 or transfer gates 310 in parallel in each stage in the inverter circuit 201 or the transfer gate circuit 301, it is possible to achieve a layout design having improved area efficiency for a semiconductor circuit having a rectangular shape using a semiconductor substrate long in one direction such as a linear sensor.

<Detail of Clock Buffer Circuit>

Figure 5A:
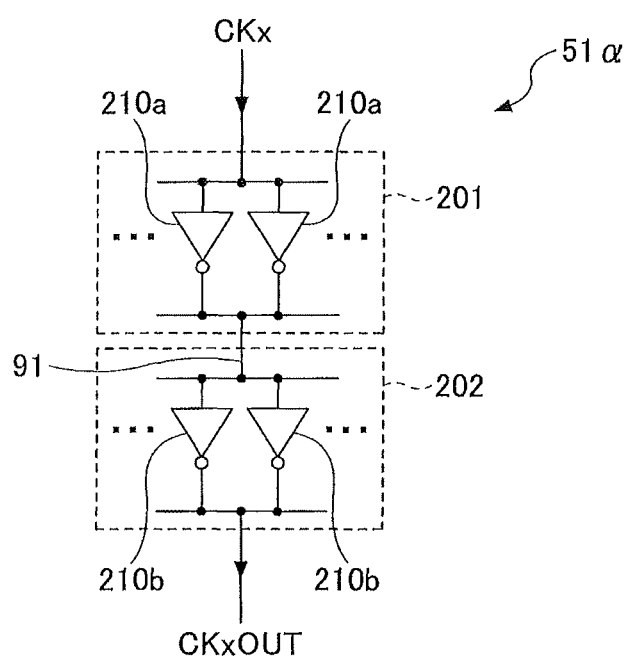
FIG. 5A is a circuit diagram illustrating a connection of inverters in one part of the clock buffer circuit of FIG. 3A.

FIG. 5A is a circuit diagram illustrating a connection of inverters in one part of the clock buffer circuit of FIG. 3A.

FIG. 5A illustrates one part of the circuit of FIG. 3A. As described above, in the first-stage inverter circuit 201 and the second-stage inverter circuit 202 of the clock buffer circuit 51a, the inverters 210 are connected together in parallel. Further, the first-stage inverter circuit 201 is connected with the second-stage inverter circuit 202 through a clock signal connection wire 91.

By thus connecting the inverters together in parallel in each stage, it is possible to achieve a layout having the improved area efficiency.

Figure 5B:
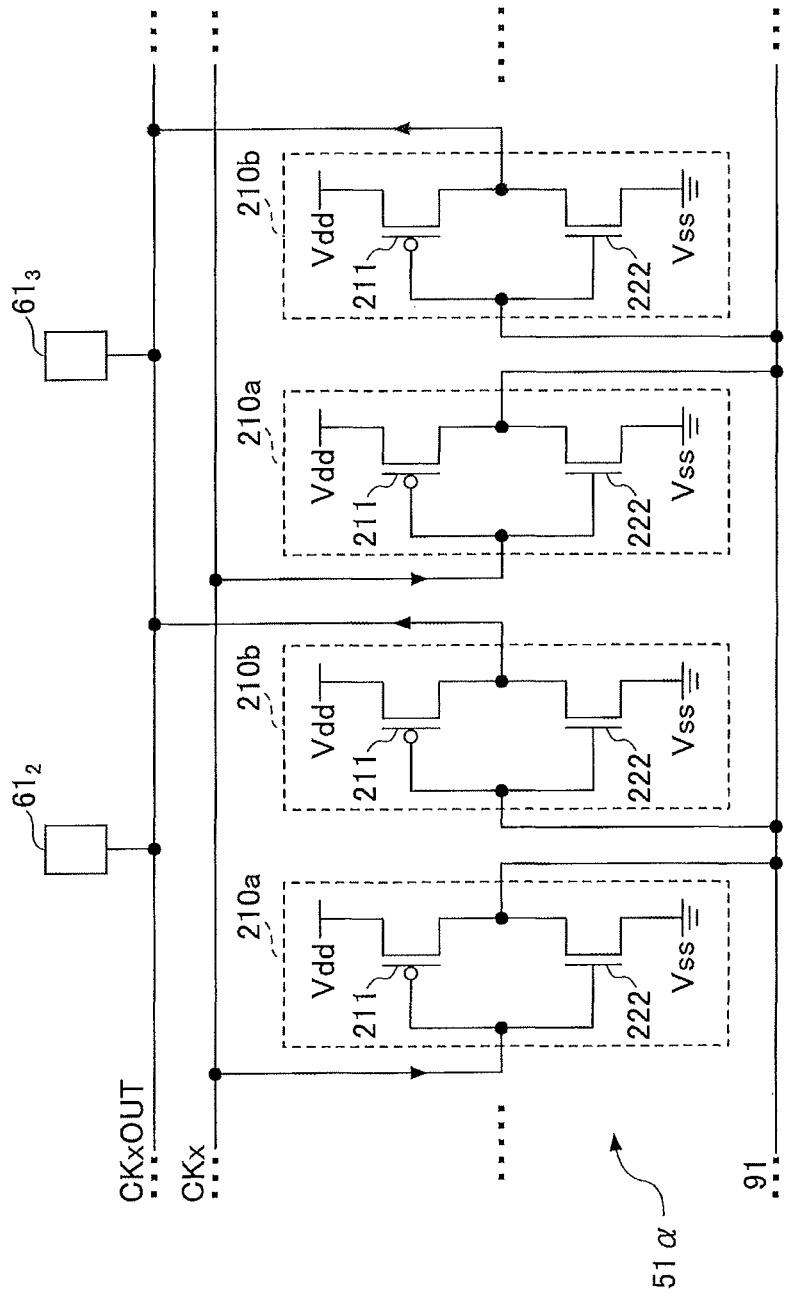
FIG. 5B illustrates a layout where the inverters illustrated in FIG. 5A use transistors, and positions of loads.

FIG. 5B illustrates a positional relationship of a layout for transistors used to form the inverters illustrated in FIG. 5A. In more detail, FIG. 5B illustrates the configurations of the inverters 210a in the first-stage inverter circuit 201 and the inverters 210b in the second-stage inverter circuit 202 and positional relationships in the layout of the inverters 210a and 210b. In FIG. 5B, the inverters 210a and 210b are arranged alternately, one by one. However, it is also possible that the inverters 210a and 210b are arranged alternately, two or more by two or more.

Because the number of inverters 210a is N whereas the number of inverters 210b is M, i.e., N<M as mentioned above, it is also possible that the ratio between the number of inverters included in each set of the inverters 210a and the number of inverters included in each set of the inverters 210b is set as N:M or is set as approximately N:M, and the inverters 210a and 210b are arranged alternately, set by set. The same method can be applied also in case of using transfer gates instead of inverters.

Also, as illustrated in FIG. 5B, each of the inverters 210a and 210b (i.e., each inverter cell) of the inverter circuits 201 and 202 included in the clock buffer circuit 51a includes a p-channel transistor 211 and a n-channel transistor 222. Then, the sizes and the shapes of the p-channel transistors 211 included in the inverter circuits 201 or 202 are made uniform. In the same way, the sizes and the shapes of the n-channel transistors 222 included in the inverter circuits 201 or 202 are made same. Thus, it is possible to achieve the further improved area efficiency.

FIG. 5B additionally illustrates an example where end devices 612 and 613 acting as loads are connected to the clock buffer circuit 51a including the respective inverters 210a and 210b. As illustrated in FIG. 5B, the two inverters 210a and 210b are associated with each of the end devices 612 and 613.

In such a type of a clock buffer circuit 51a, the signals are shaped for the end devices $61_1$ through 61p, arranged in a manner of being distributed laterally, using the inverters 210a and 210b placed closely to the respective end devices $61_1$ through 61p. Thus, it is possible to make the operation timings equal among the end devices $61_1$ through 61p. As a result, it is possible to turn on and off the end devices (switches) $61_1$ through 61p simultaneously based on the control output clock signals (for example, CKxOUT) supplied from the clock buffer circuit 51u, without occurrence of timing differences.

If a semiconductor integrated circuit 1 according to each of the embodiments is applied to a solid-state image sensing device, the lateral space may be sufficient whereas the vertical space may be limited. By configuring the clock buffer circuit 51u as illustrated in FIG. 5B, it is possible to achieve a layout suitable to such a solid-state image sensing device long in the lateral direction and short in the vertical direction, avoiding the timing errors among the end devices (switches) $61_1$ through $61p$.

Note that, also in a case where, as illustrated in FIG. 4, in the clock buffer circuit 51a, the inverter circuit 203 is replaced with the transfer gate circuit 301, each transfer gate 310 (i.e., each transfer gate cell) included in the transfer gate circuit 301 includes a p-channel transistor and an n-channel transistor.

Also in this case, by making the sizes and the shapes of the p-channel transistors included in the transfer gate circuit 301 same and making the sizes and the shapes of the n-channel transistors included in the transfer gate circuit 301 same, it is possible to achieve a layout having further improved area efficiency.

In configurations where, as illustrated in FIGS. 3A, 3B, and 4, the inverters or the transfer gates are connected together in parallel in each stage, and a plurality of the stages are connected together in series, it is possible to arrange the inverters or the transfer gates in a single line, as illustrated in FIG. 5B. As a result, it is possible to achieve a layout having improved area efficiency.

Further, it is desirable to arrange the inverters 210 or the transfer gates 310 in such a manner that the arrangement interval is sufficiently increased, without being limited to the minimum values of other design rules. In more detail, by increasing the interval between each adjacent inverters 210a and 210b in the lateral direction of FIG. 5B, it is possible to prevent the connection wires from being increased through wiring diversion to deal with a situation of each adjacent inverter 210a and 210b being too close.

By thus arranging the inverters 210 or the transfer gates 310 in such a manner that the inverters 210 or the transfer gates 310 are spaced apart along the longitudinal direction (lateral direction) of the semiconductor substrate, it is possible to shorten the distances between the end devices $61_1$ through $61p$ placed at the wiring ends and the inverters (210b in FIG. 5B, for example) or the transfer gates placed at the nearer sides in the clock buffer circuit 51a. Therefore, the reduction in wiring delay or waveform distortion of the clock signals can be achieved more effectively.

Note that, during circuit designing work, it is possible to finely adjust the cell interval. As a result, it is possible to shorten the distance between the end devices $61_1$ through $61p$ placed at the circuit end and the clock buffer circuit 51a.

Generally speaking, in the configuration of FIG. 1, if the end devices 61 and 62 are spaced apart from the respective inverters included in the corresponding clock buffer circuits 51, clock skew may occur. For example, if the clock buffer circuit 51 is placed near the end device 61c, delay differences may occur between the clock signals supplied to the central end device 61c and the clock signals supplied to the end devices $61_1$ and $61p$ placed at the ends. In order to avoid such delay differences, in the configuration of FIG. 5B, the inverters 210 included in the clock buffer circuit 51n are made to be spatially distributed, and the inverters 210b at the side nearer the end devices $61_1$ through $61p$ are placed near the end devices $61_1$ through $61p$, respectively. Thus, it is possible to reduce the delay differences (clock skew).

Further, by using the same transistors, it is possible to further reduce the timing differences (clock skew) occurring due to waveform distortion or the positional differences along the longitudinal direction of the semiconductor substrate. Thus, in this configuration, it is possible to reduce error occurrences, and ensure proper processing, even if the frequency of the clock signals is increased to implement high-speed operation.

<Phase Adjustment Circuit Example No. 1>

Figure 6:
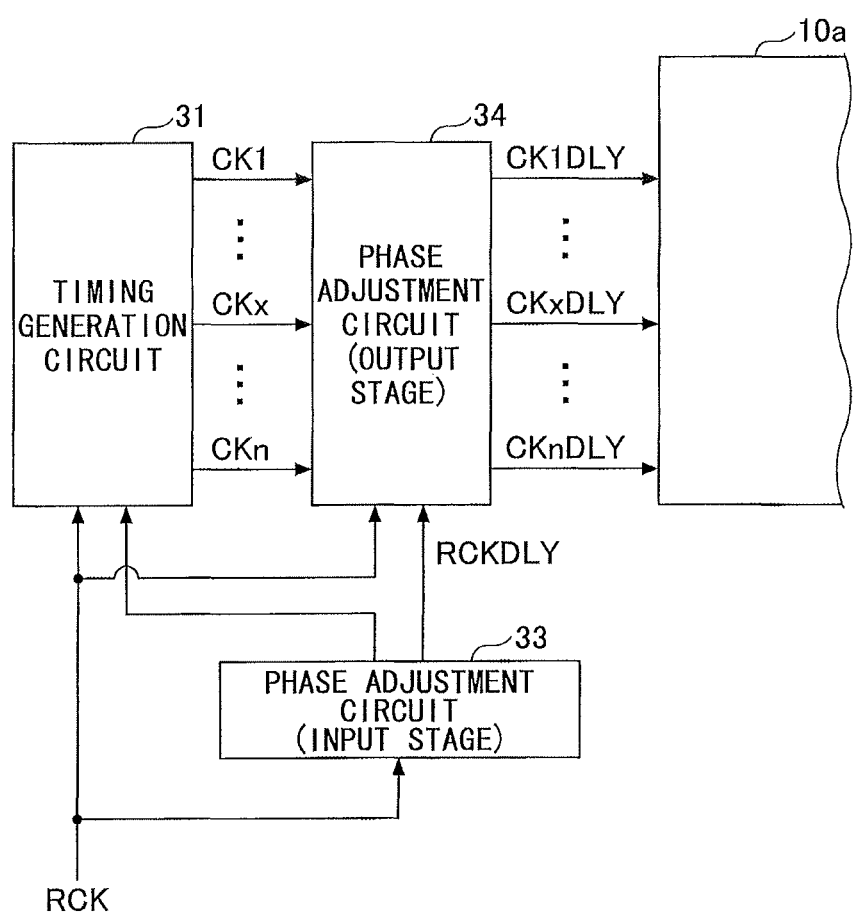
FIG. 6 illustrates an example of inserting phase adjustment circuits in an input stage and an output stage of a timing generation circuit.

FIG. 6 illustrates an example of inserting phase adjustment circuits 33 and 34 in the input stage and the output stage of the timing generation circuit 31. As illustrated in FIG. 6, the phase adjustment circuit 33 is inserted in the input stage of the timing generation circuit 31, and the phase adjustment circuit 34 is inserted in the output stage of the timing generation circuit 31.

In FIG. 6, the phase adjustment circuit 33 in the input stage generates a delay reference signal RCKDLY, and sends the delay reference signal RCKDLY to the timing generation circuit 31 and the phase adjustment circuit 34 of the output stage. The timing generation circuit 31 uses the delay reference signal RCKDLY as a reference signal for carrying out a control operation to generate the control clock signals CK1 through CKn.

The phase adjustment circuit 34 in the output stage carries out a time adjustment operation on the control clock signals CK1 through CKn that are generated by the timing generation circuit 31 based on the control reference clock signal RCK, to generate adjustment control clock signals CK1DLY through CKnDLY using the delay reference signal RCKDLY, and sends the adjustment control clock signals CK1DLY through CKnDLY to the circuit block 10a.

FIG. 7A illustrates an example of the phase adjustment circuit 33 of FIG. 6 inserted in the input stage of the timing generation circuit 31 (or 32). FIG. 7B illustrates an example of the phase adjustment circuit 34 of FIG. 6 inserted in the output stage of the timing generation circuit 31 (or 32).

The phase adjustment circuit 33 of the input stage illustrated in FIG. 7A includes, for example, delay circuits 401, 402, 403, and 404, connected together in series, and a multi-input multiplexer 410. The control reference clock signal RCK that is input to the phase adjustment circuit 33 becomes the delay reference signal RCKDLY that has a phase delay on the order of a period of greater than or equal to 0 and less than or equal to 1 with respect to the control reference clock signal RCK, using the delay circuits 401-404. The delay reference signal RCKDLY is then output.

Note that, if the delay time will be further finely determined, the number of the delay circuits may be increased to be greater than 4. In this case, the number of the inputs of the multiplexer may be increased to correspond to the number of the delay circuits, or another multiplexer may be inserted in series to the multiplexer 410 for the same purpose. It is also possible to connect a plurality of the phase adjustment circuits 33 of FIG. 7A in series for the same purpose.

The phase adjustment circuit 34 of the output stage illustrated in FIG. 7B actually includes, for example, a multiplexer 411, a clock buffer 420, and two flip-flop circuits (D-FF) 430, for each clock signal CKx (i.e., in total, includes the n sets of the circuits of FIG. 7B). In the timing generation circuit 31 (or 32) illustrated in FIG. 6, it is possible to switch a phase adjustment amount for each clock signal CKx, by controlling the multiplexer 411 to select either one of the outputs of the flip-flop circuits 430 for each clock signal CKx.

As mentioned above, to the timing generation circuit 31 (or 32), the respective phase adjustment circuits 33 and 34 that can adjust the phase of the control reference clock signal RCK are connected. Therefore, it is possible to generate the control clock signals CK1 through CKn for which the phases have been adjusted based on the control reference clock signal (delay reference signal RCKDLY).

By using the example illustrated in FIGS. 6-7B, it is possible to make the operation timings generated by the timing generation circuits 31 and 32 slightly different among the respective clock distribution networks $11_1$ through $11n$ and $12_1$ through $12n$. Thereby, it is possible to reduce intensively flowing currents, and it is possible to reduce noise occurring due to flowing current variations.

Also, by enabling fine change in the frequency of the control clock signals CK1 through CKn generated by the timing generation circuits 31 (or 32) as appropriate, it is possible to reduce the power consumption by reducing the frequency when high-speed operation is not carried out.

<Phase Adjustment Circuit Example No. 2>

Figure 8A:
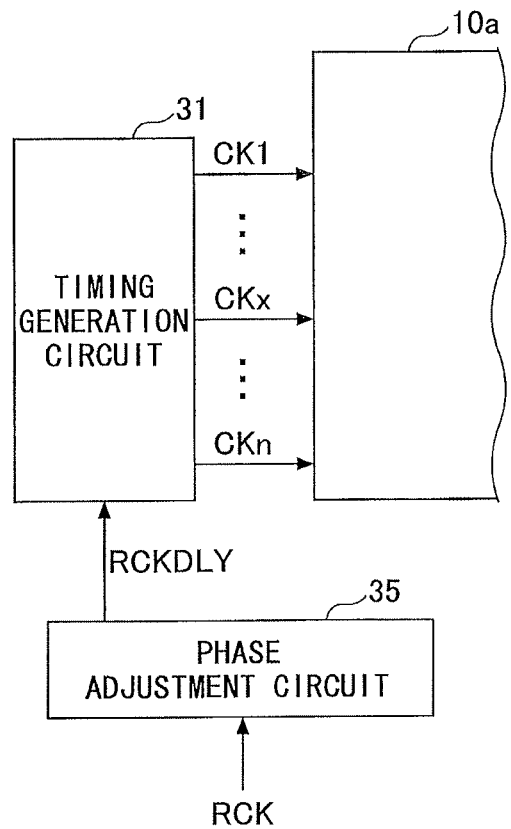
FIG. 8A illustrates an example where, in the input stage of a timing generation circuit, the phase adjustment circuit for carrying out phase adjustment of 180 degrees is inserted.
Figure 8B:
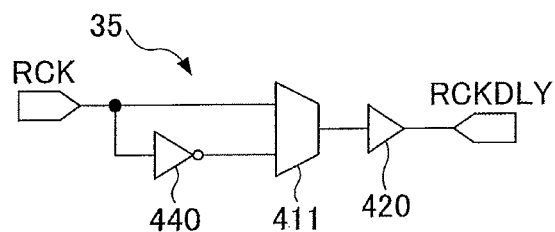
FIG. 8B illustrates an example of the phase adjustment circuit inserted in the input stage of the timing generation circuit of FIG. 8A.

FIG. 8A illustrates an example where, in the input stage of the timing generation circuit 31, a phase adjustment circuit 35 for carrying out phase adjustment of 180 degrees is inserted. FIG. 8B illustrates an example of the phase adjustment circuit 35 of FIG. 8A inserted in the input stage of the timing generation circuit 31 (or 32).

In the configuration illustrated in FIGS. 8A and 8B, the phase adjustment circuit 35 in the input stage generates a delay reference signal RCKDLY, and sends the delay reference signal RCKDLY to the timing generation circuit 31. The phase adjustment circuit 35 in the input stage illustrated in FIG. 8B includes an inverter 440, a multiplexer 411, and a clock buffer 420.

In the phase adjustment circuit 35, the inverter 440 sets the phase difference of 180 degrees between the control reference clock signal RCK that is input from the clock generation circuit 20 and the delay reference signal RCKDLY that is phase-adjusted and is output from the phase adjustment circuit 35. By thus making the operation timings different, it is possible to reduce intensively flowing currents.

In more detail, for example, a case will now be assumed where, in the configuration of FIG. 1, the phase adjustment circuits 35 of FIGS. 8A and 8B are inserted in the input stages of the timing generation circuits 31 and 32, respectively. In this case, the multiplexers 411 in the respective phase adjustment circuits 35 are controlled to select the control reference clock signal RCK and the inverted one of the control reference clock signal RCK, respectively, to generate the delay reference signals RCKDLY supplied to the timing generation circuits 31 and 32, respectively. Thereby, it is possible to create phase differences of 180 degrees between the control clock signals CK1 through CKn supplied to the circuit block 10a from the timing generation circuit 31 and the control clock signals CK1 through CKn supplied to the circuit block 10b from the timing generation circuit 32. Thus, it is possible to make the operation timings different between the respective control blocks 10a and 10b.

The phase adjustment circuit 35 illustrated in FIG. 8B thus sets the phase difference of 180 degrees to the delay reference signal RCKDLY with respect to the given control reference clock signal RCK. The phase difference is achieved, in this example, merely by inverting the control reference clock signal RCK through the inverter 440. Thus, the circuit configuration can be simplified in comparison to the configuration illustrated in FIGS. 6-7B. In the configuration of FIG. 8B, none of the multiple stages of the delay circuits 401-404 and the multi-input multiplexer 410 are used whereas the two-input multiplexer 411, the clock buffer 420, and the inverter 440 are used. Thus, the phase adjustment circuit 34 in the output stage is not used.

However, in this configuration, operation timing adjustment is limited to phase inversion of 180 degrees. Therefore, the configuration of FIGS. 6-7B is more desirable for implementing fine adjustment. Thus, any of these configurations can be selected appropriately depending on a particular use.

<Phase Adjustment Circuit Example No. 3>

Figure 9A:
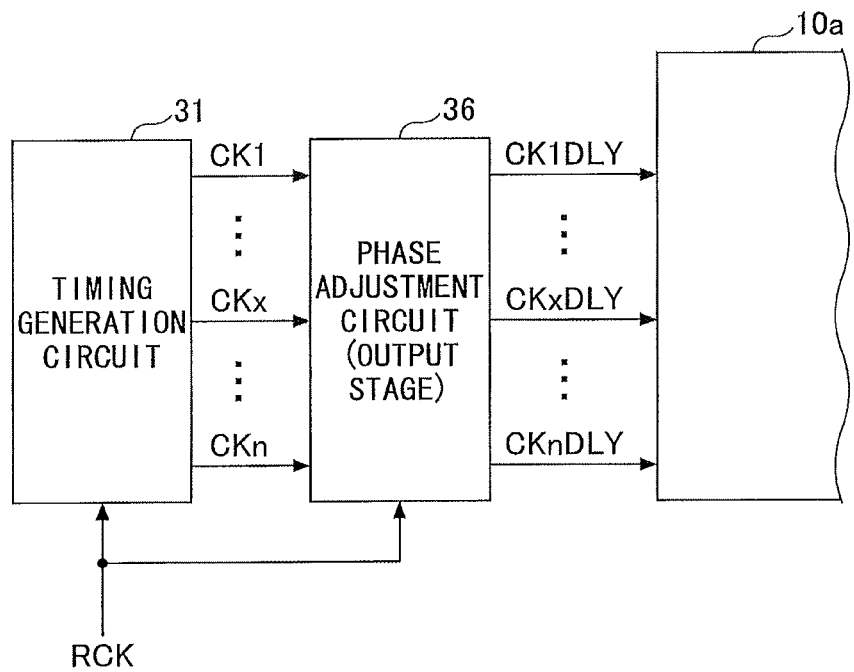
FIG. 9A illustrates an example where, in the output stage of the timing generation circuit, the phase adjustment circuit that carries out phase adjustment of 180 degrees is inserted.
Figure 9B:
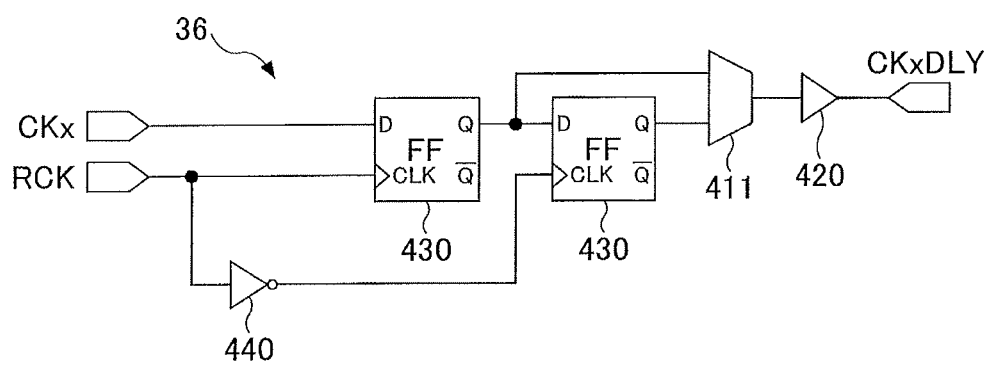
FIG. 9B illustrates one example of the phase adjustment circuit inserted in the output stage of the timing generation circuit as illustrated in FIG. 9A.

FIG. 9A illustrates an example where, in the output stage of the timing generation circuit 31, a phase adjustment circuit 36 that carries out phase adjustment of 180 degrees is inserted. FIG. 9B illustrates one example of the phase adjustment circuit 36 inserted in the output stage of the timing generation circuit 31 (or 32) as illustrated in FIG. 9A.

In the phase adjustment circuit 36 in the output stage illustrated in FIG. 9B, timings of the control clock signals CK1 through CKn generated based on the control reference clock signal RCK are adjusted using an inverter 440 for each clock signal CKx, and adjustment control clock signals CK1DLY through CKnDLY thus adjusted for the timing are output to the circuit block 10a. The phase adjustment circuit 36 illustrated in FIG. 9B actually includes the inverter 440, two flip-flop circuits (D-FF) 430, a multiplexer 411, and a clock buffer 420, for each clock signal CKx (i.e., in total, includes the n sets of the circuits of FIG. 9B).

In the example of inserting the phase adjustment circuit 36 in the output stage illustrated in FIG. 9B, in contrast with FIG. 6, no circuit to generate a delay reference signal RCKDLY as a reference clock signal is used. In more detail, the phase is changed by additionally inserting the inverter 440 in the phase adjustment circuit 34 of the output stage illustrated in FIG. 7B. Thus, the phase adjustment circuit 33 in the input stage as illustrated in FIGS. 6 and 7A is not used. Therefore, in comparison to FIG. 6, it is possible to simplify the configuration.

However, in this configuration, operation timing adjustment is limited to operation timing adjustment of 180 degrees using phase inversion. Therefore, the configuration illustrated in FIG. 6-7B is more desirable when fine adjustment is carried out. Thus, either of these configurations is selectable depending on a particular use.

By making the operation timings different using the phase adjustment circuits illustrated in FIGS. 6-9B, it is possible to reduce intensively flowing currents.

In more detail, a variation in a flowing current occurs mainly when the clock signal rises or falls. Therefore, by thus deliberately making the timings different, it is possible to distribute flowing current variations, and it is possible to reduce noise occurring due to variations in the power supply voltage or in the ground voltage caused by flowing current variations.

In the embodiments described above, in semiconductor integrated circuits, it is possible to reduce wiring delay or waveform distortion in clock signals, to enable high-speed operation.

Thus, the semiconductor integrated circuits and the methods for supplying the clock signals in the semiconductor integrated circuits have been described in the embodiments. However, embodiments are not limited to the above-described embodiments, and various modifications and replacements may be made.

What is claimed is:

1. A semiconductor integrated circuit, comprising:
   a timing generation circuit configured to generate a plurality of control clock signals based on only one input control reference clock signal; and
   a circuit block including a plurality of clock distribution networks, to which the plurality of control clock signals are respectively input,
   wherein a number of the clock distribution networks is equal to a number of the control clock signals, the plurality of clock distribution networks in the circuit block are configured to perform processes in parallel, each of the clock distribution networks includes an input buffer circuit, to which a corresponding one of the plurality of control clock signals is input; a clock buffer circuit connected to the input buffer circuit; and a plurality of end devices connected with the clock buffer circuit through clock signal connection wires that branch off from the clock buffer circuit, and a control output clock signal output from the clock buffer circuit is distributed and supplied to the end devices.

2. The semiconductor integrated circuit according to claim 1,
wherein in each of the clock distribution networks, the end devices are arranged side by side.

3. The semiconductor integrated circuit according to claim 2,
wherein in each of the clock distribution networks, the end devices are arranged in the same direction as a direction in which a clock signal connection wire connecting between the timing generation circuit and the input buffer circuit is provided.

4. The semiconductor integrated circuit according to claim 2,
wherein the clock distribution networks are arranged in a direction perpendicular to a direction in which the end devices are arranged in each of the clock distribution networks.

5. The semiconductor integrated circuit according to claim 1,
wherein in each of the clock distribution networks, the clock buffer circuit is placed approximately in a central position of the circuit block relative to a semiconductor substrate longitudinal direction.

6. The semiconductor integrated circuit according to claim 1, wherein the timing generation circuit is further configured to adjust a phase of the control reference clock signal, and generate the control clock signals based on the phase-adjusted control reference clock signal.

7. The semiconductor integrated circuit according to claim 6, wherein a phase difference between the control reference clock signal that is input to the timing generation circuit and the phase-adjusted control reference clock signal is 180 degrees.

8. The semiconductor integrated circuit according to claim 1, wherein the circuit block is configured to perform at least one of analog signal processing, analog-to-digital conversion, and digital signal processing.

9. The semiconductor integrated circuit according to claim 1, further comprising:
a clock generation circuit configured to generate the control reference clock signal, wherein
the control reference clock signal generated by the clock generation circuit has an adjustable frequency, and
the clock generation circuit is further configured to set a frequency of the control reference clock signal to a predetermined frequency, in normal operation mode, and adjust the control reference clock signal to a reduced frequency, in a power conservation mode.

10. The semiconductor integrated circuit according to claim 1, wherein the plurality of control clock signals supplied to corresponding input buffer circuits have a same timing.

11. A semiconductor integrated circuit, comprising:
a timing generation circuit configured to generate a plurality of control clock signals based on a control reference clock signal; and a circuit block including a plurality of clock distribution networks, to which the plurality of control clock signals are respectively input, wherein a number of the clock distribution networks is equal to a number of the control clock signals, the plurality of clock distribution networks in the circuit block are configured to perform processes in parallel, each of the clock distribution networks includes an input buffer circuit, to which a corresponding one of the plurality of control clock signals is input; a clock buffer circuit connected to the input buffer circuit; and a plurality of end devices connected with the clock buffer circuit through clock signal connection wires that branch off from the clock buffer circuit, a control output clock signal output from the clock buffer circuit is distributed and supplied to the end devices, and wiring lines from the timing generation circuit to each of the clock buffer circuits are of equal distance.

12. The semiconductor integrated circuit of claim 11, wherein the timing generation circuit is further configured to adjust a phase of the control reference clock signal, and generate the control clock signals based on the phase-adjusted control reference clock signal.

13. The semiconductor integrated circuit of claim 12, wherein a phase difference between the control reference clock signal that is input to the timing generation circuit and the phase-adjusted control reference clock signal is 180 degrees.

14. The semiconductor integrated circuit of claim 11, further comprising:
a clock generation circuit configured to generate the control reference clock signal, wherein
the control reference clock signal generated by the clock generation circuit has an adjustable frequency, and
the clock generation circuit is further configured to set a frequency of the control reference clock signal to a predetermined frequency, in normal operation mode, and adjust the control reference clock signal to a reduced frequency, in a power conservation mode.

15. A semiconductor integrated circuit, comprising:
a timing generation circuit configured to generate a plurality of control clock signals based on a control reference clock signal; and
a circuit block including a plurality of clock distribution networks, to which the plurality of control clock signals are respectively input,
wherein the plurality of clock distribution networks in the circuit block are configured to perform processes in parallel,
each of the clock distribution networks includes an input buffer circuit, to which a corresponding one of the plurality of control clock signals is input; a clock buffer circuit connected to the input buffer circuit; and a plurality of end devices connected with the clock buffer circuit through clock signal connection wires that branch off from the clock buffer circuit,
a control output clock signal output from the clock buffer circuit is distributed and supplied to the end devices, and
wiring lines from the timing generation circuit to each of the clock buffer circuits have no branches.

16. The semiconductor integrated circuit of claim 15, wherein a number of clock distribution networks is equal to a number of control clock signals.

17. The semiconductor integrated circuit of claim 15, wherein the timing generation circuit is further configured to adjust a phase of the control reference clock signal, and generate the control clock signals based on the phase-adjusted control reference clock signal.

18. The semiconductor integrated circuit of claim 17, wherein a phase difference between the control reference clock signal that is input to the timing generation circuit and the phase-adjusted control reference clock signal is 180 degrees.

19. The semiconductor integrated circuit of claim 15, further comprising:
   a clock generation circuit configured to generate the control reference clock signal, wherein
   the control reference clock signal generated by the clock generation circuit has an adjustable frequency, and
   the clock generation circuit is further configured to set a frequency of the control reference clock signal to a predetermined frequency, in normal operation mode, and adjust the control reference clock signal to a reduced frequency, in a power conservation mode.

* * * * *